(12) United States Patent
Ojdanic

(10) Patent No.: US 11,839,028 B2
(45) Date of Patent: Dec. 5, 2023

(54) ELECTROMAGNETIC INTERFERENCE (EMI) FILTER UNIT AND ASSOCIATED METHODS

(71) Applicant: Sidus Space, Inc., Merritt Island, FL (US)

(72) Inventor: Valerij Ojdanic, Indian Harbour Beach, FL (US)

(73) Assignee: Sidus Space, Inc., Merritt Island, FL (US)

( * ) Notice: Subject to any disclaimer, the term of this patent is extended or adjusted under 35 U.S.C. 154(b) by 0 days.

(21) Appl. No.: 17/464,309

(22) Filed: Sep. 1, 2021

(65) Prior Publication Data

US 2023/0065118 A1    Mar. 2, 2023

(51) Int. Cl.
*H05K 1/18* (2006.01)
*B64D 43/00* (2006.01)
*H05K 7/14* (2006.01)

(52) U.S. Cl.
CPC ............. *H05K 1/181* (2013.01); *B64D 43/00* (2013.01); *H05K 7/1427* (2013.01); *H05K 2201/1003* (2013.01); *H05K 2201/1006* (2013.01)

(58) Field of Classification Search
CPC ..................................................... H05K 1/181
USPC ......................................................... 361/752
See application file for complete search history.

(56) References Cited

U.S. PATENT DOCUMENTS

| | | | |
|---|---|---|---|
| 4,789,847 A | 12/1988 | Sakamoto | |
| 7,037,139 B1 * | 5/2006 | Stefaniu | H01R 13/5833 439/660 |
| RE40,750 E * | 6/2009 | Ortberg | H05K 7/1425 361/752 |
| 10,950,988 B1 * | 3/2021 | Thiel | B64U 50/19 |
| 2007/0224884 A1 | 9/2007 | Engel | |
| 2009/0253300 A1 | 10/2009 | Huang | |

(Continued)

OTHER PUBLICATIONS

Bernd Stube et al: "A novel approach for EMI design of power electronics", 2008 Design, Automation and Test in Europe: Munich, Germany, Mar. 10-14, 2008M Piscataway, NJ : IEEE Service Center, US, Mar. 10, 2008 (Mar. 10, 2008), pp. 170-175, XP058288665 DOI: 10.1145/1403375.1403418.

(Continued)

*Primary Examiner* — Stanley Tso
(74) *Attorney, Agent, or Firm* — Mark R. Malek; Jonathan D. Staudt; Widerman Malek, PL

(57) ABSTRACT

A filter unit is provided to retrofit within signal lines that couple analog cockpit gauges to transducers in rotorcraft systems. The filter unit may include a housing assembly and an electromagnetic interference (EMI) filter assembly housed therein. The filter assembly may include a printed circuit board (PCB) having conductive PCB traces and a signal line input connector configured to connect to multiple transducer signal lines. The filter assembly may also include a signal line output connector configured to connect to multiple analog cockpit gauge signal lines and a plurality of common mode chokes electrically connected between the signal line input connector and the signal line output connector. Each common mode choke may be positioned on the PCB so that it does not electrically/magnetically interfere with the other common mode chokes of the plurality of common mode chokes.

14 Claims, 3 Drawing Sheets

(56) References Cited

U.S. PATENT DOCUMENTS

| | | | |
|---|---|---|---|
| 2010/0079961 A1* | 4/2010 | Hiratsuka | H05K 1/0227 |
| | | | 361/752 |
| 2012/0176756 A1* | 7/2012 | Gailus | H01R 24/64 |
| | | | 361/752 |
| 2014/0218132 A1 | 8/2014 | Chen | |
| 2016/0058206 A1* | 3/2016 | Schwalbach | A47F 3/085 |
| | | | 361/752 |
| 2019/0156993 A1* | 5/2019 | Lou | H01R 13/719 |
| 2020/0022222 A1* | 1/2020 | Bratianu-Badea | H05B 1/0236 |
| 2021/0027928 A1* | 1/2021 | Patel | H01F 27/255 |

OTHER PUBLICATIONS

Patent Cooperation Treaty International Search Report for International Application No. PCT/US2022/075567.
Patent Cooperation Treaty Written Opinion by International Search Authority for International Application No. PCT/US2022/075567.

* cited by examiner

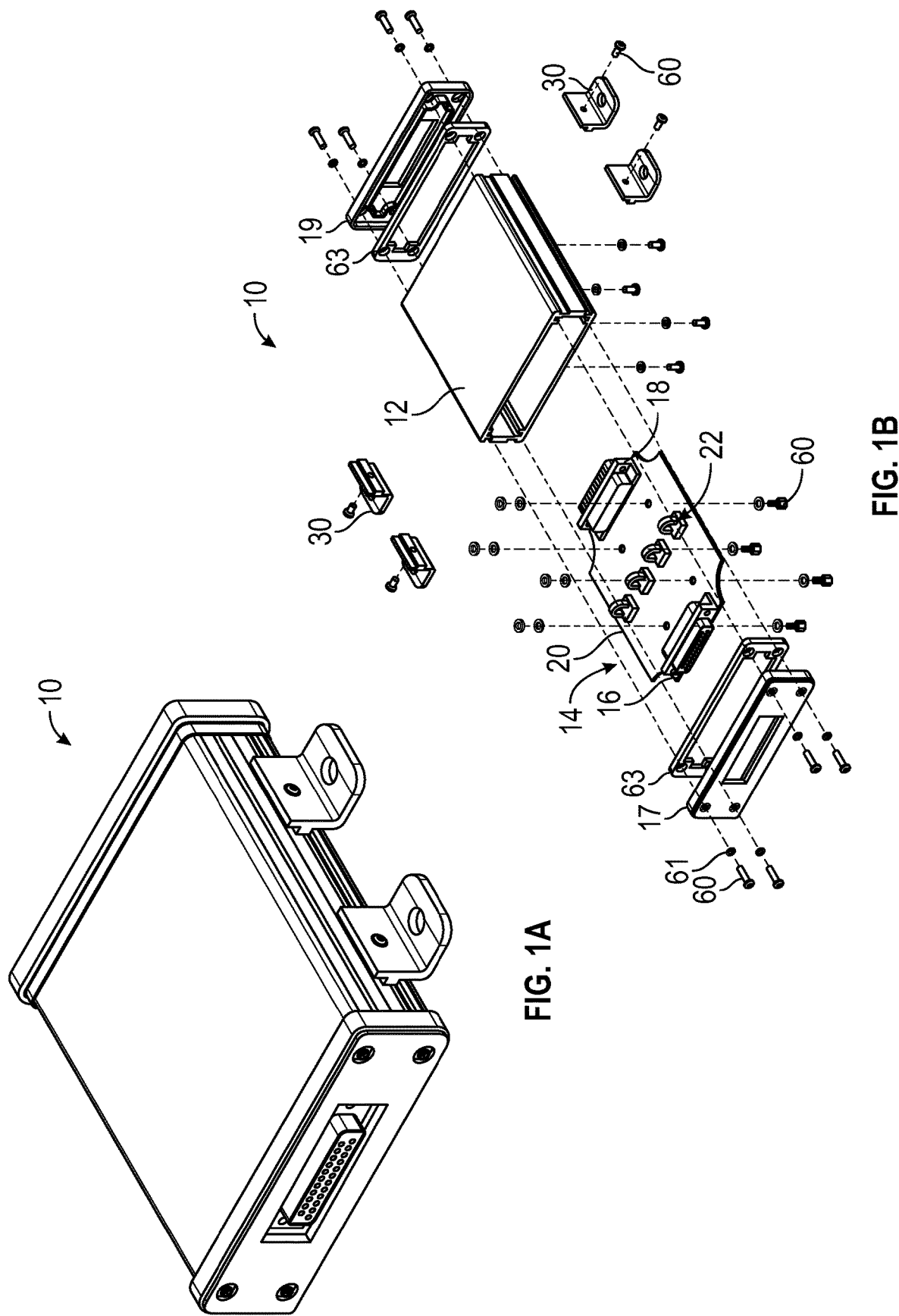

ELECTROMAGNETIC INTERFERENCE (EMI) FILTER UNIT AND ASSOCIATED METHODS

FIELD OF THE INVENTION

The present invention relates to devices, systems and methods for filtering EMI in aircraft systems.

BACKGROUND OF THE INVENTION

A rotorcraft or rotary-wing aircraft is a heavier-than-air aircraft with rotary wings or rotor blades, which generate lift by rotating around a vertical mast. Several rotor blades mounted on a single mast are referred to as a rotor. Rotorcraft generally include aircraft where one or more rotors provide lift throughout the entire flight, such as helicopters, autogyros, and gyrodynes. Compound rotorcraft augment the rotor with additional thrust engines, propellers, or static lifting surfaces. Some types, such as helicopters, are capable of vertical takeoff and landing.

Aging oil pressure gauges in rotorcraft are susceptible to interference which causes irregular fluctuations within the aircraft's cockpit gauges making them unreliable and/or unusable.

Interference is typically Common Mode (CM) noise current that is characteristically radiated from sources such as unwanted radio signals, unshielded electronics, inverters and motors, Left unfiltered, this noise presents interference problems in the gauges, electronics and electrical circuits.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention are related to filtering of EMI in aircraft systems to prevent unwanted fluctuations in cockpit gauges.

Embodiments of the present invention are directed to a filter unit to retrofit within signal lines that couple analog cockpit gauges to transducers in rotorcraft systems. The filter unit includes a housing assembly including mounting features, and an electromagnetic interference (EMI) filter assembly housed within the housing assembly. The EMI filter assembly includes a printed circuit board (PCB) having conductive PCB traces, a signal line input connector positioned in a side of the housing assembly, electrically coupled to the PCB, and configured to connect to multiple transducer signal lines, and a signal line output connector positioned in an opposite side of the housing, electrically coupled to the PCB, and configured to connect to multiple analog cockpit gauge signal lines. A plurality of common mode chokes are positioned on the PCB and electrically connected between the signal line input connector and the signal line output connector via the conductive PCB traces. Each common mode choke is positioned on the PCB so that it does not electrically/magnetically interfere with the other common mode chokes of the plurality of common mode chokes.

Additionally, and/or alternatively, in certain embodiments the mounting features include slidable mounting flanges so that mounting positions are adjustable.

Additionally, and/or alternatively, in certain embodiments the conductive PCB traces include equal length conductive PCB traces to increase rejection of common mode noise and increase electromagnetic compatibility (EMC).

Additionally, and/or alternatively, in certain embodiments the analog cockpit gauges include oil pressure gauges, and the transducers include oil pressure transducers. The pressure gauges may include a first-engine oil pressure gauge, a second-engine oil pressure gauge, a combining gearbox (C-Box) oil pressure gauge, and a transmission oil pressure gauge. The plurality of common mode chokes may include a common mode choke for each respective oil pressure gauge.

Additionally, and/or alternatively, in certain embodiments the EMI filter assembly is configured to filter 400 Hz AC signals from the multiple transducer signal lines to the cockpit gauge signal lines.

Another embodiment is directed to a filter unit for signal lines that couple analog gauges to respective transducers. The filter unit includes a housing assembly, and an electromagnetic interference (EMI) filter assembly housed within the housing assembly. The EMI filter assembly includes a printed circuit board (PCB) having conductive PCB traces, a signal line input connector electrically coupled to the PCB, and configured to connect to multiple transducer signal lines, and a signal line output connector electrically coupled to the PCB, and configured to connect to multiple analog gauge signal lines. A plurality of common mode chokes are positioned on the PCB and electrically connected between the signal line input connector and the signal line output connector via the conductive PCB traces. Each common mode choke of the plurality of common mode chokes is positioned on the PCB so that it does not electrically/magnetically interfere with the other common mode chokes of the plurality of common mode chokes.

Additionally, and/or alternatively, in certain embodiments the housing assembly includes slidable mounting flanges on edges of the housing assembly so that mounting positions of the slidable mounting flanges are adjustable.

Additionally, and/or alternatively, in certain embodiments the conductive PCB traces include equal length conductive PCB traces to increase rejection of common mode noise and increase electromagnetic compatibility (EMC).

Additionally, and/or alternatively, in certain embodiments the analog gauges include oil pressure gauges, and the transducers comprise oil pressure transducers.

Additionally, and/or alternatively, in certain embodiments the plurality of common mode chokes includes a common mode choke for each respective oil pressure gauge.

Additionally, and/or alternatively, in certain embodiments the EMI filter assembly is configured to filter 400 Hz AC signals from the multiple transducer signal lines to the gauge signal lines.

Another embodiment is directed to a filter unit for AC signal lines. The filter unit includes a housing assembly, and an electromagnetic interference (EMI) filter assembly housed within the housing assembly. The EMI includes a printed circuit board (PCB) having conductive PCB traces, a signal line input connector electrically coupled to the PCB, and configured to connect to multiple AC signal input lines, and a signal line output connector electrically coupled to the PCB, and configured to connect to multiple AC signal output lines. A plurality of common mode chokes are positioned on the PCB and electrically connected between the signal line input connector and the signal line output connector via the conductive PCB traces. Each common mode choke of the plurality of common mode chokes is positioned on the PCB so that it does not electrically/magnetically interfere with the other common mode chokes of the plurality of common mode chokes. The conductive PCB traces are equal length conductive PCB traces to increase rejection of common mode noise and increase electromagnetic compatibility (EMC).

Additionally, and/or alternatively, in certain embodiments the housing assembly includes slidable mounting flanges on edges of the housing assembly so that mounting positions of the slidable mounting flanges are adjustable.

Additionally, and/or alternatively, in certain embodiments the plurality of common mode chokes includes a respective common mode choke for each AC signal line.

Additionally, and/or alternatively, in certain embodiments the EMI filter assembly is configured to filter 400 Hz AC signals on the AC signal lines.

BRIEF DESCRIPTION OF THE DRAWINGS

Some embodiments of the present invention are illustrated as an example and are not limited by the figures of the accompanying drawings, in which like references may indicate similar elements.

FIG. 1A is an isometric view of an embodiment of an EMI filter unit in accordance with features of the present invention.

FIG. 1B is an exploded view of the EMI filter unit of FIG. 1.

DETAILED DESCRIPTION OF THE INVENTION

Figure 2A:
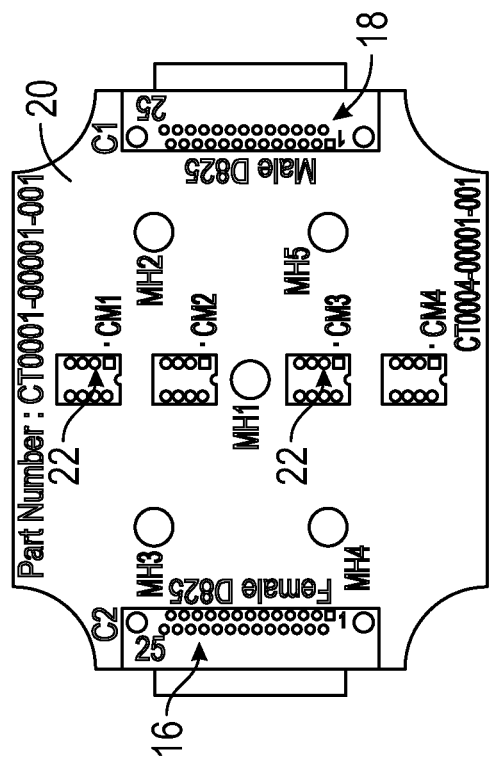
FIGS. 2A-2D are various views of the PCB features of the EMI filter unit of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Before describing the present disclosure in detail, it is to be understood that this disclosure is not limited to parameters of the particularly exemplified systems, methods, apparatus, products, processes, and/or kits, which may, of course, vary. It is also to be understood that the terminology used herein is only for the purpose of describing particular embodiments of the present disclosure, and is not necessarily intended to limit the scope of the disclosure in any particular manner. Thus, while the present disclosure will be described in detail with reference to specific embodiments, features, aspects, configurations, etc., the descriptions are illustrative and are not to be construed as limiting the scope of the claimed invention. Various modifications can be made to the illustrated embodiments, features, aspects, configurations, etc. without departing from the spirit and scope of the invention as defined by the claims. Thus, while various aspects and embodiments have been disclosed herein, other aspects and embodiments are contemplated.

Unless defined otherwise, all technical and scientific terms used herein have the same meaning as commonly understood by one of ordinary skill in the art to which the present disclosure pertains. While a number of methods and materials similar or equivalent to those described herein can be used in the practice of the present disclosure, only certain exemplary materials and methods are described herein.

Various aspects of the present disclosure, including devices, systems, methods, etc., may be illustrated with reference to one or more exemplary embodiments or implementations. As used herein, the terms "embodiment," "alternative embodiment" and/or "exemplary implementation" means "serving as an example, instance, or illustration," and should not necessarily be construed as preferred or advantageous over other embodiments or implementations disclosed herein. In addition, reference to an "implementation" of the present disclosure or invention includes a specific reference to one or more embodiments thereof, and vice versa, and is intended to provide illustrative examples without limiting the scope of the invention, which is indicated by the appended claims rather than by the following description.

It will be noted that, as used in this specification and the appended claims, the singular forms "a," "an" and "the" include plural referents unless the content clearly dictates otherwise. Thus, for example, reference to a "sensor" includes one, two, or more sensors.

As used throughout this application the words "can" and "may" are used in a permissive sense (i.e., meaning having the potential to), rather than the mandatory sense (i.e., meaning must), Additionally, the terms "including," "having," "involving," "containing," "characterized by," variants thereof (e.g., "includes," "has," and "involves," "contains," etc.), and similar terms as used herein, including the claims, shall be inclusive and/or open-ended, shall have the same meaning as the word "comprising" and variants thereof (e.g., "comprise" and "comprises"), and do not exclude additional, un-recited elements or method steps, illustratively.

Various aspects of the present disclosure can be illustrated by describing components that are coupled, attached, connected, and/or joined together. As used herein, the terms "coupled", "attached", "connected," and/or "joined" are used to indicate either a direct connection between two components or, where appropriate, an indirect connection to one another through intervening or intermediate components. In contrast, when a component is referred to as being "directly coupled", "directly attached", "directly connected," and/or "directly joined" to another component, no intervening elements are present or contemplated. Thus, as used herein, the terms "connection," "connected," and the like do not necessarily imply direct contact between the two or more elements. In addition, components that are coupled, attached, connected, and/or joined together are not necessarily (reversibly or permanently) secured to one another. For instance, coupling, attaching, connecting, and/or joining can comprise placing, positioning, and/or disposing the components together or otherwise adjacent in some implementations.

As used herein, directional and/or arbitrary terms, such as "top," "bottom," "front," "back," "left," "right," "up," "down," "upper," "lower," "inner," "outer," "internal," "external," "interior," "exterior," "proximal," "distal" and the like can be used solely to indicate relative directions and/or orientations and may not otherwise be intended to limit the scope of the disclosure, including the specification, invention, and/or claims.

Where possible, like numbering of elements have been used in various figures. In addition, similar elements and/or elements having similar functions may be designated by similar numbering (e.g., element and element "210.") Furthermore, alternative configurations of a particular element may each include separate letters appended to the element number. Accordingly, an appended letter can be used to designate an alternative design, structure, function, implementation, and/or embodiment of an element or feature without an appended letter. Similarly, multiple instances of an element and or sub-elements of a parent element may each include separate letters appended to the element number. In each case, the element label may be used without an appended letter to generally refer to instances of the element or any one of the alternative elements. Element labels including an appended letter can be used to refer to a specific instance of the element or to distinguish or draw attention to multiple uses of the element. However, element labels including an appended letter are not meant to be limited to the specific and/or particular embodiment(s) in which they are illustrated. In other words, reference to a specific feature in relation to one embodiment should not be construed as being limited to applications only within said embodiment.

It will also be appreciated that where a range of values (e.g., less than, greater than, at least, and/or up to a certain value, and/or between two recited values) is disclosed or recited, any specific value or range of values falling within the disclosed range of values is likewise disclosed and contemplated herein.

It is also noted that systems, methods, apparatus, devices, products, processes, compositions, and/or kits, etc., according to certain embodiments of the present invention may include, incorporate, or otherwise comprise properties, features, aspects, steps, components, members, and/or elements described in other embodiments disclosed and/or described herein. Thus, reference to a specific feature, aspect, steps, component, member, element, etc. in relation to one embodiment should not be construed as being limited to applications only within said embodiment. In addition, reference to a specific benefit, advantage, problem, solution, method of use, etc. in relation to one embodiment should not be construed as being limited to applications only within the embodiment.

The headings used herein are for organizational purposes only and are not meant to be used to limit the scope of the description or the claims. To facilitate understanding, like reference numerals have been used, where possible, to designate like elements common to the figures.

Electromagnetic compatibility (EMC) is the ability of electrical equipment and systems to function acceptably in their electromagnetic environment, by limiting the unintentional generation, propagation and reception of electromagnetic energy which may cause unwanted effects such as electromagnetic interference (EMI) or even physical damage in operational equipment. The goal of EMC is the correct operation of different equipment in a common electromagnetic environment.

As discussed, aging oil pressure gauges in rotorcraft are susceptible to interference which causes irregular fluctuations within the aircraft's cockpit gauges making them unreliable and/or unusable.

FIG. 1A is an isometric view of an embodiment of an EMI filter unit 10 in accordance with features of the present invention. FIG. 1B is an exploded view of the EMI filter unit 10. The EMI filter unit 10 is for the filtering of EMI in aircraft systems to prevent unwanted fluctuations in cockpit gauges, for example. The EMI filter unit 10 may be retrofitted within signal lines that couple analog cockpit gauges to transducers in rotorcraft systems.

The EMI filter unit 10 includes a housing assembly 12 and an EMI filter assembly 14 housed within the housing assembly. FIGS. 2A-2D are various views of the printed circuit board (PCB) features of the EMI filter unit 10. The EMI filter assembly 14 includes a PCB 20 having conductive PCB traces 21, a signal line input connector 16 positioned in a first side 17 of the housing assembly 12, electrically coupled to the PCB 20, and configured to connect to multiple transducer signal lines 50. A signal line output connector 18 is positioned in an opposite side 19 of the housing assembly 12, electrically coupled to the PCB 20, and configured to connect to multiple analog cockpit gauge signal lines 52. Various housing hardware includes, for example, mounting screws 60, washers 61, nuts 62, and environmental seals 63.

A plurality of common mode chokes 22 are positioned on the PCB 20 and electrically connected between the signal line input connector 16 and the signal line output connector 18 via the conductive PCB traces 21. Each common mode choke 22 is positioned on the PCB 20 so that it does not electrically/magnetically interfere with the other common mode chokes 22. As such common mode chokes 22 filter EMI noise independent of each other and can be used to filter various sensor signals that operate on, for example, 28

Volt AC power and 400 Hz (+/−20%) frequency. The conductive PCB traces 21 are positioned in the differential pairs and are equal in length and resistance (pair) to increase rejection of common mode noise and increase electromagnetic compatibility (EMC).

Figure 2B:
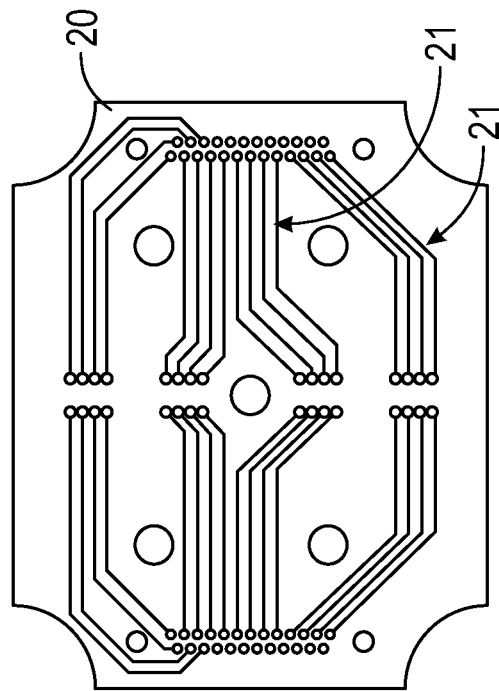
Figure 2C:
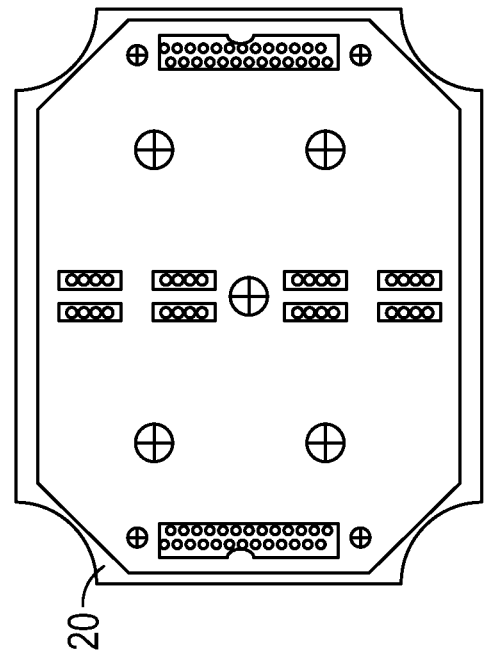
Figure 2D:
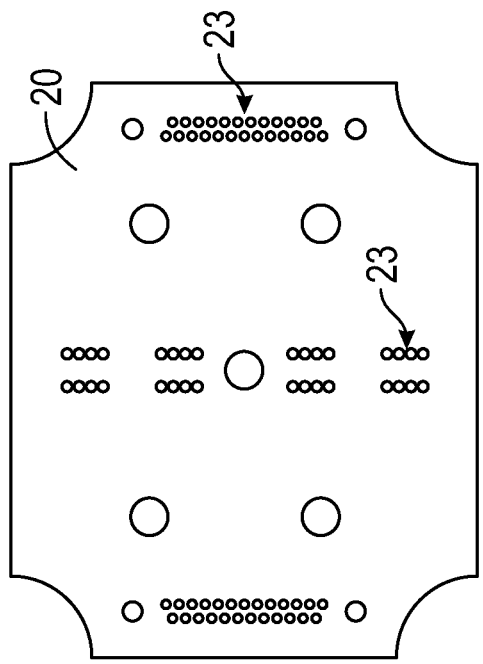

FIGS. 2A-2D are various views of the PCB 20 features of the EMI filter unit 10. FIG. 2A illustrates an example of a top view of the PCB 20 and including mounting positions for the common mode chokes 22, the signal line input connector 16 and signal line output connector 18. FIG. 2B illustrates an example of the pattern of the conductive PCB traces 21, for example, on an inner layer. FIG. 2C illustrates an example of the bottom view of the PCB 20. FIG. 2D illustrates an example of the through hole pattern 23 of the PCB 20.

In certain embodiments there are mounting features on the housing assembly 12 such as slidable mounting flanges 30 so that mounting positions are adjustable. The mounting flanges 30 (e.g. four mounting flanges) are slidable along an edge of the housing assembly 12 and may be secured in a position via a set screw 31. The mounting flanges 30 include mounting holes 32 to receive a fastener (e.g. screw) to mount the EMI filter unit 10 to a mounting surface (e.g. within an aircraft).

The analog cockpit gauges may include oil pressure gauges, and the transducers may include oil pressure transducers. As such, the plurality of common mode chokes 22 may include a common mode choke 22 for each respective oil pressure gauge.

Figure 3:
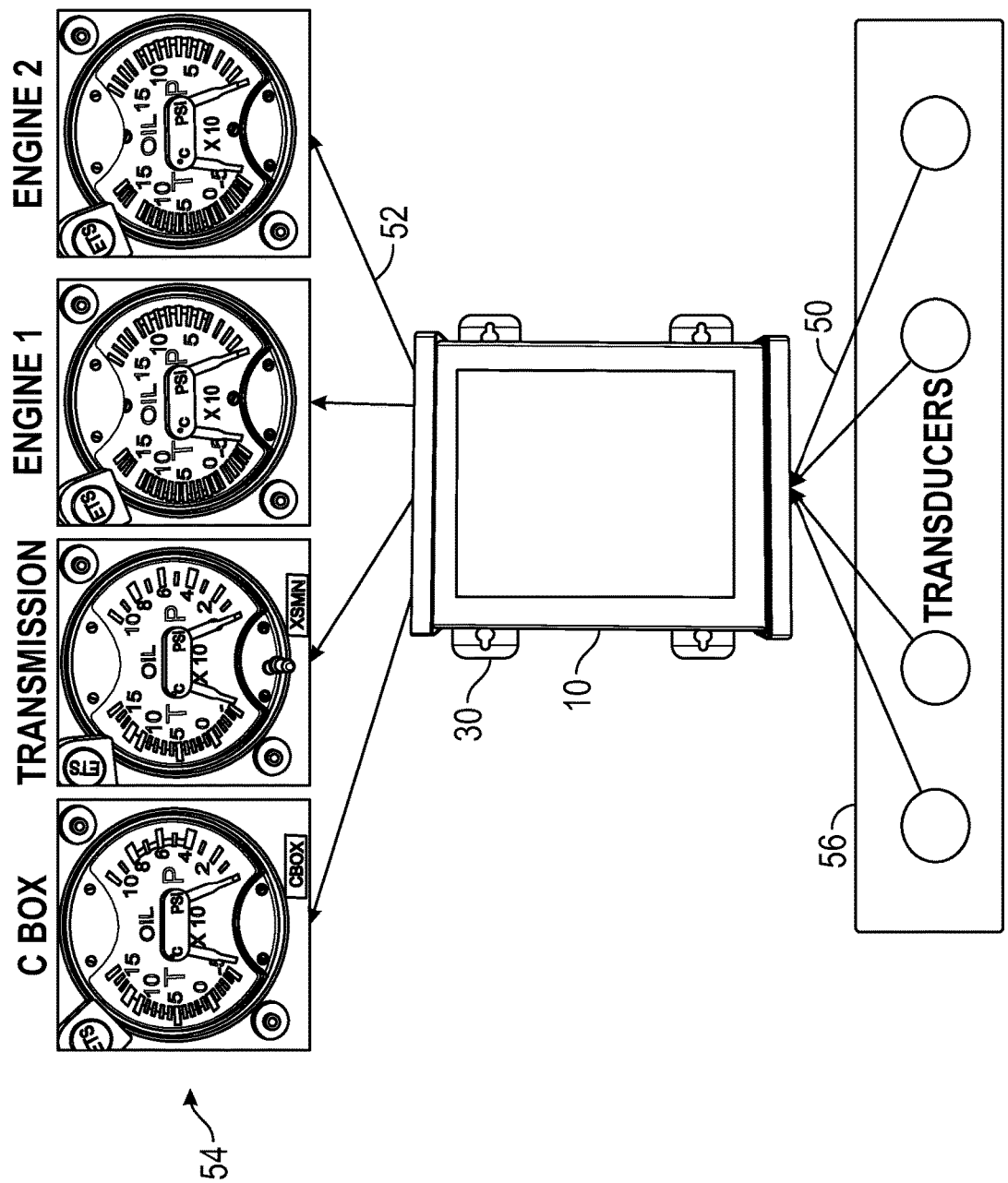
FIG. 3 is a schematic diagram illustrating the EMI filter unit of FIG. 1 in an aircraft environment.

Referring additionally to FIG. 3, the aircraft cockpit gauges 54 may typically include Engine 1 oil pressure, Engine 2 oil pressure, Transmission oil pressure and C-box (Combining gearbox) oil pressure. Associated temperature gauges are typically included for each of these also. The gauges are coupled to transducers 56 via transducer signal lines 50. For example, the EMI filter unit 10 may filter signal lines for up to eight gauges that have an AC power supply/AC signal.

A pressure transducer, often called a pressure transmitter, is a transducer that converts pressure into an analog electrical signal. Although there are various types of pressure transducers, one of the most common is the strain-gage base transducer. The conversion of pressure into an electrical signal is achieved by the physical deformation of strain gages which are bonded into the diaphragm of the pressure transducer and wired into a Wheatstone bridge configuration. Pressure applied to the pressure transducer produces a deflection of the diaphragm which introduces strain to the gages. The strain will produce an electrical resistance change proportional to the pressure.

Each of the common mode chokes 22 is an electrical filter that blocks high frequency noise common to two or more data or power lines while allowing the desired DC or low-frequency signal to pass. In normal or differential mode (single choke), current travels on one line in one direction from the source to the load, and in the opposite direction on the return line that completes the circuit. In common mode, the noise current travels on both lines in the same direction.

In common mode, the current in a group of lines travels in the same direction so the combined magnetic flux adds to create an opposing field to block the noise. In differential mode, the current travels in opposite directions and the flux subtracts or cancels out so that the field does not oppose the normal mode signal. The criteria for selecting a common mode choke are: Required impedance or How much attenuation of noise is needed; Required frequency range or over what frequency bandwidth is the noise; and Required current-handling or How much differential mode current must it handle.

Noise attenuation of the common mode chokes 22 is a logarithmic expression in decibels (dB) and is the ratio of the input transient voltage (VTI) to the output transient voltage (VTO). 20 log 10× (VTI/VTO), thus 10:1-20 dB, 100:1-40 dB, 1000:1-60 dB, and 1,000,000-120 dB, for example.

Common mode choke coils are used to suppress common mode noise. This type of coil is produced by winding the signal or supply wires around a ferrite core. Since magnetic flux flows inside the ferrite core, common mode choke coils work as an inductor against common mode current. Accordingly, using a common mode choke coil provides larger impedance against common mode current and is more effective for common mode noise suppression than using several normal inductors. Since magnetic flux cancels out inside the ferrite core, impedance is not produced for differential mode current. The magnetic saturation problem is small.

Thus, as described above, the EMI filter unit 10 of the present embodiments may be retrofitted and installed, saves space versus other approaches, and is a cost effective approach for extending the life of aging oil pressure gauges in a rotorcraft, e.g. a helicopter such as a Bell 212 (UH-1ST) helicopter. However, the EMI filter unit 10 is compatible with many helicopters or aircraft platforms, including, but not limited to the Bell 212 (UH-1ST) or similar.

The EMI filter unit 10 includes the ability to support telecommunications equipment that meet FCC and CCITT requirements. The common mode chokes 22 are configured to provide a >20 dB attenuation of common mode noise over the 3 to 300 MHz frequency range, for example.

The EMI filter unit 10 filters sensor line signals, for example, transducers' AC signals on analog gauges for helicopters. For example, the EMI filter unit 10 may be used for filtering 400 Hz signals on the helicopter systems. However, the EMI filter unit 10 can be used on any aircraft that has AC signals (e.g. 400 Hz frequency) and analog gauges. The PCB 20 is configured to boost filter capabilities. Common mode chokes 22 on the PCB 20 are arranged in the way that they don't interfere (magnetic or electrical) with each other and PCB traces 21 may have equal length so rejection of common mode noise (EMI/EMC) is improved.

Noise sources may include power converters, transformers, the adjoining of differing materials, thermal noise, rotating metal parts, VHF/UHF radio and antenna's electrostatic build up and resulting magnetic field, and relatively high 0 material that will display substantial ringing and produce spectral noise energy. An example of a common mode choke 22 is the Coilcraft TRF-400L Tip and Ring Common Mode Filter which provides ≥20 dB attenuation of common mode noise over the 3 MHz to 300 MHz and ≥6 dB above 300 MHz frequencies.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced items.

Thus, the scope of the invention should be determined by the appended claims and their legal equivalents, and not by the examples given.

What is claimed is:

1. A filter unit to retrofit within signal lines that couple analog cockpit gauges to transducers in rotorcraft systems, the filter unit comprising:
    a housing assembly including mounting features; and
    an electromagnetic interference (EMI) filter assembly housed within the housing assembly and including:
        a printed circuit board (PCB) having conductive PCB traces;
        a signal line input connector positioned in a side of the housing assembly, electrically coupled to the PCB, and removably connectable to at least one transducer signal line;
        a signal line output connector positioned in a directionally opposite side of the housing assembly relative to the signal line input connector, electrically coupled to the PCB, and removably connectable to at least one analog signal line; and
        a plurality of common mode chokes positioned on the PCB and electrically connected between the signal line input connector and the signal line output connector via the conductive PCB traces;
        wherein each common mode choke of the plurality of common mode chokes is positioned on the PCB so that it does not electrically or magnetically interfere with the other common mode chokes of the plurality of common mode chokes;
    a first environmental seal positioned between the signal line input connector and a first side of the housing assembly; and
    a second environmental seal positioned between the signal line output connector and an opposite side of the housing assembly;
    wherein the first environmental seal is fixedly attached to the first side of the housing assembly and the housing assembly;
    wherein the second environmental seal is fixedly attached to the opposite side of the housing assembly and the housing assembly; and
    wherein the mounting features comprise slidable mounting flanges so that mounting positions are adjustable.

2. The filter unit according to claim 1, wherein the conductive PCB traces comprises equal length conductive PCB traces to increase rejection of common mode noise and increase electromagnetic compatibility (EMC).

3. The filter unit according to claim 1, wherein the analog cockpit gauges comprise oil pressure gauges, and the transducers comprise oil pressure transducers.

4. The filter unit according to claim 3, wherein the oil pressure gauges comprise a first-engine oil pressure gauge, a second-engine oil pressure gauge, a combining gearbox (C-Box) oil pressure gauge, and a transmission oil pressure gauge.

5. The filter unit according to claim 3, wherein the plurality of common mode chokes includes a common mode choke for each respective oil pressure gauge.

6. The filter unit according to claim 1, wherein the EMI filter assembly is configured to filter 400 Hz AC signals from the multiple transducer signal lines to the cockpit gauge signal lines.

7. A filter unit for signal lines that couple analog gauges to respective transducers, the filter unit comprising:
    a housing assembly; and
    an electromagnetic interference (EMI) filter assembly housed within the housing assembly and including:
        a printed circuit board (PCB) having conductive PCB traces;
        a signal line input connector electrically coupled to the PCB, and removably connectable to at least one transducer signal line;
        a signal line output connector electrically coupled to the PCB, and removably connectable to at least one analog gauge signal line; and
        a plurality of common mode chokes positioned on the PCB and electrically connected between the signal line input connector and the signal line output connector via the conductive PCB traces;
        wherein each common mode choke of the plurality of common mode chokes is positioned on the PCB so that it does not electrically or magnetically interfere with the other common mode chokes of the plurality of common mode chokes;
    a first environmental seal positioned between the signal line input connector and a first side of the housing assembly; and
    a second environmental seal positioned between the signal line output connector and an opposite side of the housing assembly;
    wherein the first environmental seal is fixedly attached to the first side of the housing assembly and the housing assembly;
    wherein the second environmental seal is fixedly attached to the opposite side of the housing assembly and the housing assembly; and
    wherein the housing assembly includes slidable mounting flanges on edges of the housing assembly so that mounting positions of the slidable mounting flanges are adjustable.

8. The filter unit according to claim 7, wherein the conductive PCB traces comprises equal length conductive PCB traces to increase rejection of common mode noise and increase electromagnetic compatibility (EMC).

9. The filter unit according to claim 7, wherein the analog gauges comprise oil pressure gauges, and the transducers comprise oil pressure transducers.

10. The filter unit according to claim 9, wherein the plurality of common mode chokes includes a common mode choke for each respective oil pressure gauge.

11. The filter unit according to claim 7, wherein the EMI filter assembly is configured to filter 400 Hz AC signals from the multiple transducer signal lines to the gauge signal lines.

12. A filter unit for AC signal lines, the filter unit comprising:
a housing assembly; and
an electromagnetic interference (EMI) filter assembly housed within the housing assembly and including:
a printed circuit board (PCB) having conductive PCB traces;
a signal line input connector electrically coupled to the PCB, and removably connectable to at least one AC signal input line;
a signal line output connector electrically coupled to the PCB, and removably connectable to at least one AC signal output line; and
a plurality of common mode chokes positioned on the PCB and electrically connected between the signal line input connector and the signal line output connector via the conductive PCB traces;
wherein each common mode choke of the plurality of common mode chokes is positioned on the PCB so that it does not electrically or magnetically interfere with the other common mode chokes of the plurality of common mode chokes; and
wherein the conductive PCB traces comprises equal length conductive PCB traces to increase rejection of common mode noise and increase electromagnetic compatibility (EMC);
a first environmental seal positioned between the signal line input connector and a first side of the housing assembly; and
a second environmental seal positioned between the signal line output connector and an opposite side of the housing assembly;
wherein the first environmental seal is fixedly attached to the first side of the housing assembly and the housing assembly;
wherein the second environmental seal is fixedly attached to the opposite side of the housing assembly and the housing assembly; and
wherein the housing assembly includes slidable mounting flanges on edges of the housing assembly so that mounting positions of the slidable mounting flanges are adjustable.

13. The filter unit according to claim 12, wherein the plurality of common mode chokes includes a respective common mode choke for each AC signal line.

14. The filter unit according to claim 12, wherein the EMI filter assembly is configured to filter 400 Hz AC signals on the AC signal lines.

* * * * *